United States Patent [19]

Taniyama

[11] Patent Number: 4,677,421
[45] Date of Patent: Jun. 30, 1987

[54] DIGITAL INFORMATION SIGNAL ENCODING METHOD WITH REDUCED RUN LENGTH AND IMPROVED SELF-CLOCKING

[75] Inventor: Seiro Taniyama, Kanagawa, Japan

[73] Assignee: Sony Corporation, Tokyo, Japan

[21] Appl. No.: 785,855

[22] Filed: Oct. 9, 1985

[30] Foreign Application Priority Data

Oct. 11, 1984 [JP] Japan .................................. 59-213030

[51] Int. Cl.$^4$ ............................................. H03M 7/00
[52] U.S. Cl. .............................. 340/347 DD; 358/261; 360/39; 360/40; 375/19
[58] Field of Search .................. 375/19; 340/347 DD; 358/261; 360/39, 40

[56] References Cited

U.S. PATENT DOCUMENTS 4,387,364 6/1983 Shirota ............................ 358/261 X

OTHER PUBLICATIONS

Lewis, Markers in Run-Length-Limited Codes, IBM Technical Disclosure Bulletin, vol. 13, No. 8, 1/1971, pp. 2241 & 2242.

Primary Examiner—I. J. Sloyan
Attorney, Agent, or Firm—Lewis H. Eslinger; Alvin Sinderbrand

[57] ABSTRACT

A method of reducing the DC component in a digital information signal comprised of a plurality of 8-bit data words by converting each of the 8-bit data words to a 10-bit data word, comprises the steps of: selecting the 10-bit data words having a sequence of no more than two bits both at the logic level "1" or "0" from both boundaries of the 10-bit data words; classifying the selected 10-bit data words into a first group consisting of 10-bit data words having five logic level "1" bits, a second group consisting of 10-bit data words having six logic level "1" bits, and a third group consisting of 10-bit data words having four logic level "1" bits, with the third group being formed by inverting the 10-bit data words in the second group; and further assigning the 8-bit words alternately to the 10-bit words in the second and third groups when such 8-bit words correspond to previously assigned 10-bit words having six logic level "1" bits and assigning the remaining 8-bit words to the 10-bit words in the first group.

5 Claims, 5 Drawing Figures

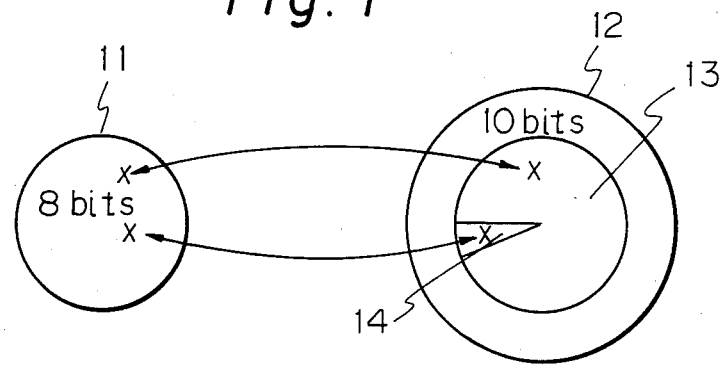
Fig. 1
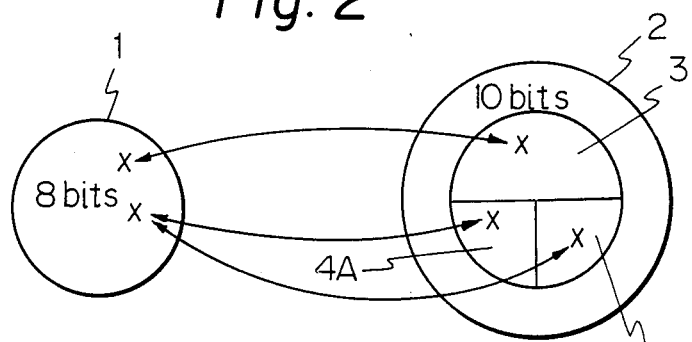
Fig. 2
Fig. 4
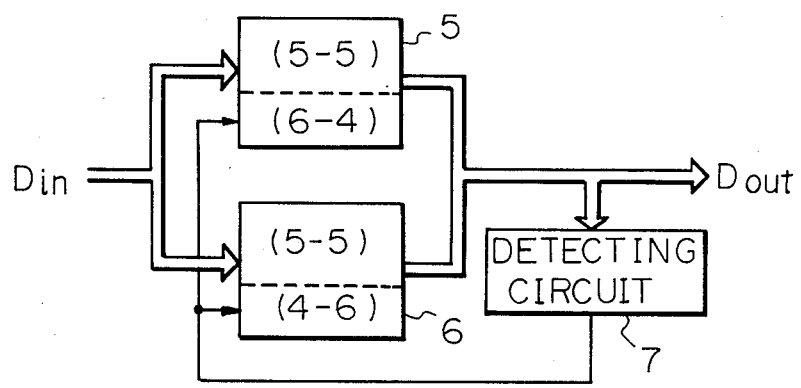

| DATA WORD | CODE WORD | DATA WORD | CODE WORD |
|---|---|---|---|
| 128 | 00101111011 | 160 | 01101011010 |
| 129 | 00110111011 | 161 | 01101011100 |
| 130 | 00110111101 | 162 | 10001101111 |
| 131 | 00111011011 | 163 | 10001110111 |
| 132 | 00111011101 | 164 | 10010101111 |
| 133 | 00111101011 | 165 | 10010110111 |
| 134 | 00111101101 | 166 | 10010111011 |
| 135 | 01001011011 | 167 | 10011001111 |
| 136 | 01001011101 | 168 | 10011010111 |
| 137 | 01001101011 | 169 | 10011011011 |
| 138 | 01001101101 | 170 | 10011011101 |
| 139 | 01001110011 | 171 | 10011100111 |
| 140 | 01010011011 | 172 | 10011101011 |
| 141 | 01010011101 | 173 | 10011101101 |
| 142 | 01010101101 | 174 | 10011110011 |
| 143 | 01010110011 | 175 | 10011110101 |
| 144 | 01010110101 | 176 | 10100101111 |
| 145 | 01010110110 | 177 | 10100110111 |
| 146 | 01011001011 | 178 | 10100111011 |
| 147 | 01011001101 | 179 | 10101001111 |
| 148 | 01011001110 | 180 | 10101010111 |
| 149 | 01011010011 | 181 | 10101011011 |
| 150 | 01011010101 | 182 | 10101011101 |
| 151 | 01011010110 | 183 | 10101100111 |
| 152 | 01011100011 | 184 | 10101101011 |
| 153 | 01011100101 | 185 | 10101101101 |
| 154 | 01011100110 | 186 | 10101110011 |
| 155 | 01101001011 | 187 | 10101110101 |
| 156 | 01101001101 | 188 | 10110001111 |
| 157 | 01101010011 | 189 | 10110010111 |
| 158 | 01101010101 | 190 | 10110011011 |
| 159 | 01101011001 | 191 | 10110011101 |

Fig. 3C

| DATA WORD | CODE WORD | DATA WORD | CODE WORD |
|---|---|---|---|
| 192 | 10110100111 | 224 | 10110011100 |
| 193 | 10110101011 | 225 | 10110101010 |
| 194 | 10110101101 | 226 | 10110101001 |
| 195 | 10110110011 | 227 | 10111010010 |
| 196 | 10110110101 | 228 | 10111001010 |
| 197 | 11000101111 | 229 | 11000100110 |
| 198 | 11000110111 | 230 | 11000101010 |
| 199 | 11000111011 | 231 | 11000110110 |
| 200 | 11001001111 | 232 | 11000110101 |
| 201 | 11001010111 | 233 | 11000111001 |
| 202 | 11001011011 | 234 | 11001001010 |
| 203 | 11001011101 | 235 | 11001010101 |
| 204 | 11001100111 | 236 | 11001010010 |
| 205 | 11001101011 | 237 | 11001010001 |
| 206 | 11001101101 | 238 | 11001100110 |
| 207 | 11001110011 | 239 | 11001100101 |
| 208 | 11001110101 | 240 | 11001101010 |
| 209 | 11010001111 | 241 | 11001110010 |
| 210 | 11010010111 | 242 | 11001110001 |
| 211 | 11010011011 | 243 | 11010001110 |
| 212 | 11010011101 | 244 | 11010010110 |
| 213 | 11010100111 | 245 | 11010010101 |
| 214 | 11010101011 | 246 | 11010011010 |
| 215 | 11010101101 | 247 | 11010100110 |
| 216 | 11010110011 | 248 | 11010100101 |
| 217 | 11010110101 | 249 | 11010101010 |
| 218 | 11011001011 | 250 | 11010101001 |
| 219 | 11011001101 | 251 | 11010110010 |
| 220 | 11011010011 | 252 | 11010110001 |
| 221 | 11011010101 | 253 | 11011000110 |
| 222 | 11011100010 | 254 | 11011000101 |
| 223 | 10111011010 | 255 | 11011001100 |

DIGITAL INFORMATION SIGNAL ENCODING METHOD WITH REDUCED RUN LENGTH AND IMPROVED SELF-CLOCKING

FIELD OF THE INVENTION AND RELATED ART STATEMENT

The present invention relates to a digital information signal encoding method which is applied where digital data is recorded on a recording medium such as an optical disk, optical magnetic disk, magnetic tape, or the like and, more particularly, to an improvement of a digital information signal encoding method for converting 8-bit data words to 10-bit code words.

As a conventional channel encoding method for reducing DC components, i.e., for what is called DC free, the 8-to-10 bit conversion encoding method is known. This method is excellent in terms of conversion efficiency and ease of encoding and decoding. In this channel encoding method, 8-bit data words of a digital information signal are made to correspond to respective 10-bit code words.

FIG. 1 is a diagram to explain a conventional 8-10 converting method, in which reference numeral 11 denotes a set of 256 ($=2^8$) 8-bit data words and numeral 12 indicates a set of 1024 ($=2^{10}$) 10-bit codes. Among the 10-bit codes, the 10-bit code in which the number of "0" bits and the number of "1" bits are both equal to five is selected as the code word. This code word can reduce the DC component since the digital sum (the integration value when bit "0" counts as $-1$ and bit "1" counts as $+1$) becomes 0 in one word.

In FIG. 1, numeral 13 denotes a set of codes having a (5-5) pattern in which the number of "0" bits and the number of "1" bits are both equal to five. A total of 252 code words are included in the set 13, so that four more codes are needed to assign all the 8-bit data words. Therefore, a set 14 consisting of four codes having either a (4-6) pattern in which the number of "1" bits is four and the number of "0" bits is six or a (6-4) pattern in which the number of "1" bits is six and the number of "0" bits is four is added to the set 13. In this manner, a total of 256 code words consisting of both of the sets 13 and 14 are derived and the data words can be assigned on a one-to-one correspondence basis.

According to the conventional 8-10 conversion encoding method, assuming that the length between code bits is T, the maximum length between transitions $T_{max}$ can increase to a value in excess of 10T, so that a large amount of low frequency components are included and the signal frequency band is extended. Thus, when digital data is recorded on an optical disk or when the digital data is reproduced from the optical disk, an arrangement of the analog signal circuit system becomes complicated. In addition, there is also a problem in the self-clock system, so that the clock extraction from the reproduced signal becomes unstable.

OBJECT AND SUMMARY OF THE INVENTION

It is therefore an object of the present invention to provide a digital information signal encoding method in which the maximum length between transitions $T_{max}$ is set to 4T, which is advantageously small compared with that by a conventional 8-10 converting method.

This object is accomplished by a method for encoding a digital information signal comprised of a plurality of N-bit data words, comprising the steps of: generating M-bit data words in which M is an even integer greater than N and each of the N-bit and M-bit data words is comprised of a plurality of logic level "1" bits and logic level "0" bits; selecting the M-bit data words having a sequence of no more than two bits both at the logic level "1" or "0" from both boundaries of the M-bit data words; classifying the selected M-bit data words into a first group consisting of the M-bit data words which have an equal number of "1" and "0" bits, a second group consisting of the M-bit data words which have a number of "1" bits greater than the number of "0" bits, and a third group consisting of the M-bit data words which have a number of "0" bits greater than the number of "1" bits; and assigning each of the N-bit data words to at least a respective one of the M-bit data words, with some of the N-bit data words being assigned alternately to the M-bit data words of the second and third groups and the remainder of the N-bit data words being assigned to the M-bit data words of the first group.

In addition, this invention relates to a digital information signal encoding method characterized in that, to prevent the insufficient reduction of the DC component due to an increase in number of code words of the (4-6) pattern or in number of code words of the (6-4) pattern among code words, each of the code words of the (6-4) pattern in which the number of "1" bits is six and the number of "0" bits is four or the code words of the (4-6) pattern in which the number of "1" bits is four and the number of "0" bits is six among the 10-bit code words has the code word which is complementary with regard to the code word of itself, and the code words of the (6-4) pattern and the code words of the (4-6) pattern alternately appear in a sequence of the output code words.

In accordance with the present invention, by reducing the number of continuous "0" or "1" bits to four or less, the length between transitions in one word can be set to 4T or less. On the other hand, by reducing the numer of continuous "0" or "1" bits at both ends of each word to two or less, the length between transitions of the output data $D_{out}$ composed of the continuous code words can be set to 4T or less. Consequently, the maximum length between transitions $T_{max}$ can be set to 4T.

The above and other objects, features and advantages of the present invention will be more apparent from the following detailed description in conjunction with the accompanying drawings.

BRIEF DESCRIPTION OF THE DRAWINGS

FIG. 1 is a schematic diagram which is used to explain a conventional channel encoding method;

FIG. 2 is a schematic diagram which is used to explain one embodiment of the present invention;

FIGS. 3A to 3C are schematic diagrams showing one example of the correspondence relationship between the data words and the code words in one embodiment of the present invention; and FIG. 4 is a block diagram of an encoding apparatus embodying the present invention.

DETAILED DESCRIPTION OF A PREFERRED EMBODIMENT

One embodiment of the present invention will now be described hereinbelow with reference to the drawings. FIG. 2 shows the correspondence between the data words and the code words of the present invention. In FIG. 2, reference numeral 1 denotes a set of 8-bit data words. The set 1 includes 256 codes. Numeral 2 represents a set of all 1024 10-bit codes. In the set 2, a set of 352 data words is formed by a set 3 of 160 code words of the (5-5) pattern, a set 4A of 96 code words of the (6-4) pattern and a set 4B of 96 code words of the (4-6) pattern There is a complementary relation between the code words of the set 4A and the code words of the set 4B. In other words, there is an inversion relation between the words in sets 4A and 4B with regard to the bits "1" and "0".

The code words of the (5-5) pattern are made to correspond to 160 data words on a one-to-one correspondence basis. The remaining 96 data words are made correspond to pairs each consisting of the complementary code words of the (6-4) and (4-6) patterns on a one-to-one correspondence basis.

One reason why the complementary code words are prepared is to make it possible to reduce the DC component in the encoded output since the digital sum converges to 0 as the code words of the (6-4) pattern and the code words of the (4-6) pattern alternately appear.

For the encoding process, the 8-bit data words are made to correspond to the 10-bit code words. On the contrary, for the decoding process, the 10-bit code words are made to correspond to the 8-bit data words.

Figure 3A:
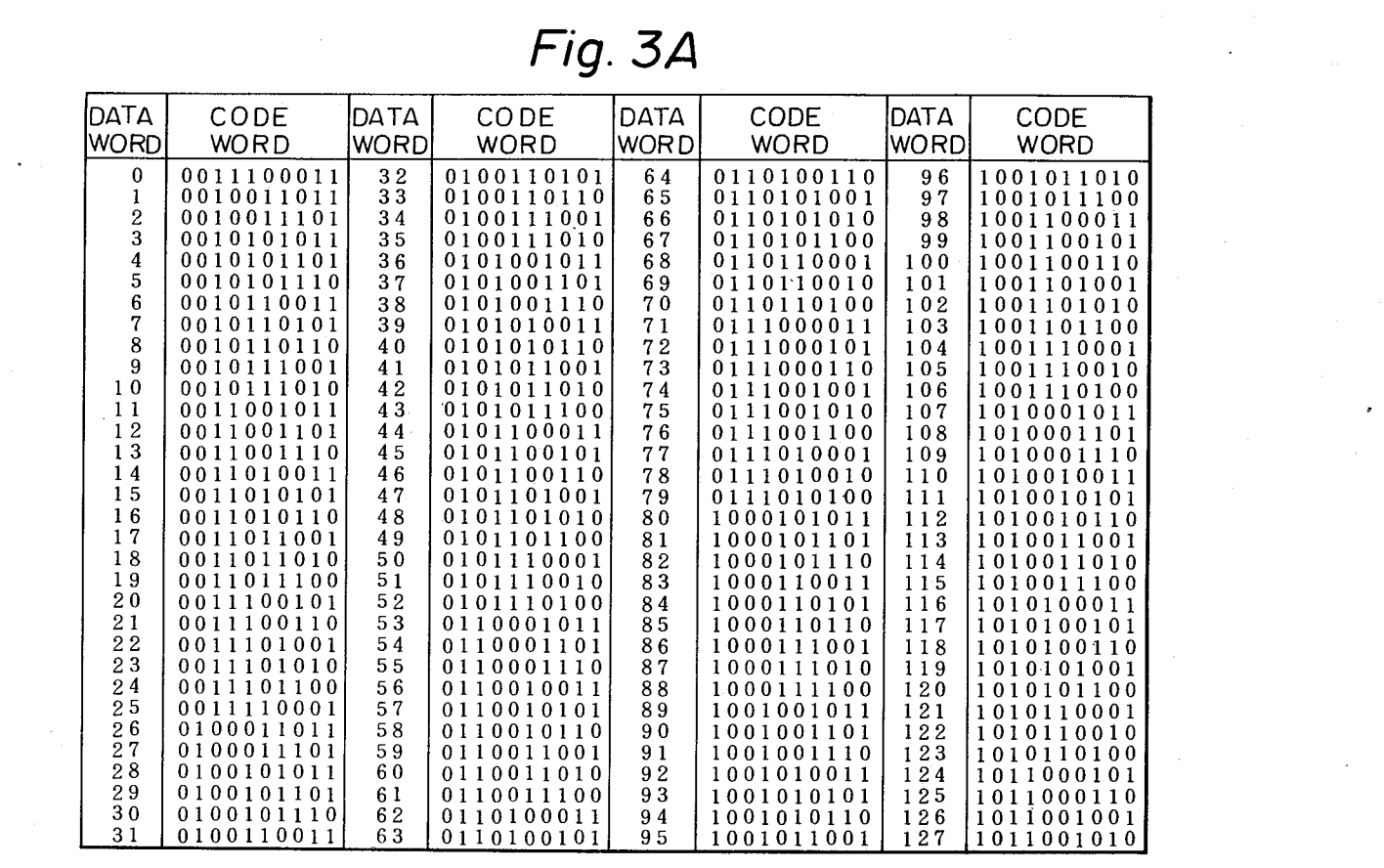

FIGS. 3A to 3C show an example of the correspondence relation between the data words and the code words, in which the 8-bit data words are indicated by values of 0 to 255.

For 128 data words (0 to 127) shown in FIG. 3A, the code words of the (5-5) pattern having four or less continuous "0" or "1" bits and two or less continuous "0" or "1" bits at both ends of each word are assigned.

On the other hand, as shown in FIG. 3B, for 96 data words (128 to 223), the pairs of complementary code words of the (6-4) and (4-6) pattern in which four or less continuous "0" or "1" bits exist in one word and two or less continuous "0" or "1" bits at both ends of each word. The 96 code words of the (6-4) pattern differ from each other. Similarly, the 96 code words of the (4-6) pattern also differ from each other. Only the code words of the (6-4) pattern among the complementary code words are shown in FIG. 3B for simplicity.

Further, for 32 data words (224 to 255) shown in FIG. 3C, code words of the (5-5) pattern in which four or less continuous "0" or "1" bits exist in one word and two or less continuous "0" or "1" bits at both ends of each word are assigned.

According to the conversion tables shown in FIGS. 3A to 3C, the length between transitions in one word of a data word can be set to 4T or less. The length between transitions can be also set to 4T or less even in the case of the data series in which continuous data words exist. Consequently, the maximum length between transitions $T_{max}$ in this invention becomes 4T. While an example of the conversion tables is shown in FIGS. 3A to 3C, other various correspondence relations between the data words and the code words are possible.

FIG. 4 shows an encoding apparatus corresponding to the encoding method according to the invention.

In FIG. 4, reference numerals 5 and 6 identify ROMs in which the conversion tables are stored. The 160 code words of the (5-5) pattern and the 96 code words of the (6-4) pattern are stored in the ROM 5. The 160 code words of the (5-5) pattern and the 96 code words of the (4-6) pattern are stored in the ROM 6. Input data $D_{in}$ containing continuous 8-bit data words is supplied as address inputs of the ROMs 5 and 6. The input data $D_{in}$ is digital data or sample data of a digital information signal, or the like.

The conversion table for the (5-5) pattern of the ROM 5 is identical to the conversion table for the (5-5) pattern of the ROM 6. There is a complementary relation between the code words constituted the conversion table for the (6-4) pattern of the ROM 5 and the code words constituting the conversion table for the (4-6) pattern of the ROM 6. Output data $D_{out}$ read out from the ROMs 5 and 6 is composed of serial or continuous 10-bit data words. The output data $D_{out}$ is taken out as an output and also supplied to a detecting circuit 7. The detecting circuit 7 discriminates to which one of the (6-4) and (4-6) patterns the code word of the output data $D_{out}$ read out from the ROM 5 or ROM 6 belongs. An output of the detecting circuit 7 is supplied as the most significant bit of the address input while the timing is made coincident with that of the next data words of the ROMs 5 and 6.

The output signal of the detecting circuit 7 has a high level when, for example, the output data $D_{out}$ is a code word of the (6-4) pattern and a low level when the output data $D_{out}$ is a code word of the (4-6) pattern. When the output data $D_{out}$ is a code word of the (5-5) pattern, the detection signal may be either at a low or high level. The conversion table including the code words of the (6-4) pattern of the ROM 5 is selected when the detection signal is at a low level, and the conversion table including the code words of the (4-6) pattern of the ROM 6 is selected when the detecting signal is at a high level. Therefore, the code words of the (6-4) pattern and the code words of the (4-6) pattern alternately appear in the series of the output data $D_{out}$ due to change-over between the ROMs 5 and 6 by the detecting circuit 7.

Although not shown, the decoding apparatus has a construction opposite to that of the foregoing encoding apparatus with respect to the input and output.

According to the present invention, the maximum length between transitions $T_{max}$ of the output data $D_{out}$ can be set to 4T and the frequency band of the output data $D_{out}$ can be narrowed as compared with the conventional 8-10 conversion encoding method. At the same time, the clock extraction in the self-clock system can be stably performed. In addition, the invention has advantages in that the arrangement of the encoding apparatus based on the 8-10 conversion encoding method is simple and a good converting efficiency is obtained.

Although the present invention has been shown and described with respect to a preferred embodiment, various changes and modifications which are obvious to a person skilled in the art to which the invention pertains are deemed to lie within the spirit and scope of the invention.

What is claimed is:

1. A method for encoding a digital information signal consisting of a plurality of N-bit data words, comprising the steps of:
   generating M-bit data words in which M is an even integer greater than N and each of said N-bit and M-bit data words is comprised of a plurality of logic level "1" bits and logic level "0" bits;
   selecting those M-bit data words having a sequence of no more than two bits all at logic level "1" or "0" extending inwardly from both boundaries of those M-bit data words and in which all sequences of bits all at logic level "1" or "0" are no longer than four bits within those M-bit data words;

classifying the selected M-bit data words into a first group consisting of those M-bit data words having an equal number of said "1" and "0" bits, a second group consisting of those M-bit data words having a greater number of said "1" bits than of said "0" bits, and a third group consisting of those M-bit data words which have a greater number of said "0" bits than of said "1" bits;

assigning each of said N-bit data words to at least a respectively one of said M-bit data words, some of said N-bit data words being assigned alternately to M-bit data words of said second and third groups and the remainder of said N-bit data words being assigned to M-bit data words of said first group; and emitting an output stream of immediately contiguous assigned M-bit data words in response to an input stream of N-bit data words, said output stream being adapted for improved self-clocking with reduced low frequency components.

2. A method according to claim 1, wherein each of said M-bit data words of said second group is an inverted version of a corresponding M-bit data word of the third group.

3. A method according to claim 2, wherein said step of assigning includes, after an N-bit data word has been assigned to one of said M-bit data words from one of said second and third groups, assigning the next N-bit data word assignable to an M-bit data word from one of said second and third groups to an M-bit data word from the other of said second and third groups.

4. A method according to claim 3, wherein M is equal to 10 and N is equal to 8, and 256 10-bit data words are generated.

5. A method according to claim 4, wherein said first group consists of 160 M-bit data words and each of said second and third groups consists of 96 M-bit data words.

* * * * *